United States Patent
Lee et al.

(10) Patent No.: US 7,442,639 B2
(45) Date of Patent: Oct. 28, 2008

(54) METHOD OF FORMING PLUG OF SEMICONDUCTOR DEVICE

(75) Inventors: Han-Choon Lee, Seoul (KR); Jin-Woo Park, Kyungki-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 241 days.

(21) Appl. No.: 11/027,408

(22) Filed: Dec. 30, 2004

(65) Prior Publication Data

US 2005/0142845 A1    Jun. 30, 2005

(30) Foreign Application Priority Data

Dec. 31, 2003    (KR) ................. 10-2003-0101829

(51) Int. Cl.
*H01L 21/4763* (2006.01)
(52) U.S. Cl. .................. 438/643; 257/E21.226; 438/653
(58) Field of Classification Search .......... 438/643, 438/642, 725; 257/E21.226, E21.222
See application file for complete search history.

(56) References Cited

U.S. PATENT DOCUMENTS

| | | | |
|---|---|---|---|
| 6,069,073 A | 5/2000 | Kim et al. | |
| 6,531,389 B1 * | 3/2003 | Shue et al. | 438/637 |
| 6,562,416 B2 * | 5/2003 | Ngo et al. | 427/534 |
| 6,703,708 B2 * | 3/2004 | Werkhoven et al. | 257/751 |
| 6,893,953 B2 * | 5/2005 | Hoshino et al. | 438/618 |
| 2002/0127840 A1 * | 9/2002 | Smith et al. | 438/618 |
| 2002/0162736 A1 * | 11/2002 | Ngo et al. | 204/192.12 |
| 2004/0063310 A1 * | 4/2004 | Ngo et al. | 438/637 |
| 2005/0009325 A1 * | 1/2005 | Chung et al. | 438/637 |
| 2005/0159012 A1 * | 7/2005 | Ohto et al. | 438/751 |

FOREIGN PATENT DOCUMENTS

JP    07-273120 A    * 10/1995

* cited by examiner

*Primary Examiner*—Caridad M Everhart
(74) *Attorney, Agent, or Firm*—Andrew D. Fortney

(57) ABSTRACT

A method for forming a plug of a semiconductor device according to a preferred embodiment includes forming a metal wiring on a semiconductor substrate, forming an interlayer dielectric layer on the semiconductor substrate having the metal wiring, forming a contact hole for partially exposing the metal wiring by selectively etching the interlayer dielectric layer, annealing the semiconductor substrate having the contact hole using $NH_3$ gas, plasma processing the annealed semiconductor substrate using the $NH_3$, and forming a barrier layer on the interlayer dielectric layer having the contact hole.

22 Claims, 2 Drawing Sheets

METHOD OF FORMING PLUG OF SEMICONDUCTOR DEVICE

BACKGROUND OF THE INVENTION (a) Field of the Invention

The present disclosure relates to a semiconductor device and, in particular, to a method for forming a plug inside a contact hole of the semiconductor device for coupling upper and lower metal wirings, which is capable of reducing interface contact resistance for coupling upper and lower metal wirings.

(b) Description of the Related Art

As the linewidth specified by a design rule decreases, the density and/or integration of devices in a semiconductor device fabrication process increases. In most, if not all, advanced semiconductor devices, a plug structure is utilized. The plug is generally formed by sequentially depositing an interlayer dielectric layer on a lower layer of metal (e.g., copper) wiring, forming a contact hole partly exposing the lower metal wiring, and filling the contact hole with a conductive layer to form the plug, whereby the plug electrically connects the upper and lower metal wirings.

However, when the contact hole for connecting the upper and lower metal wirings is formed, there has been a problem in that polymers containing atoms such as carbon (C) are produced due to the photoresist and/or the etching gas. Also, if the lower metal wiring is exposed through the contact hole, the surface of the exposed metal wiring chemically may react with the oxygen in the atmosphere so as to form a natural oxide layer on the surface of the lower metal wiring. That is, if a lower metal wiring formed out of copper is exposed to the atmosphere, a copper oxide (CuO) is formed on the surface of the exposed copper wiring, which increases the interface contact resistance.

In order to remove the carbon-containing polymer and/or the natural oxide layer formed on the surface of the lower metal wiring, one may perform a baking process in a vacuum state, a sputtering process using argon (Ar) gas, or an annealing process using nitrogen or oxygen. However, sputtering with argon (Ar) gas and annealing with nitrogen and/or oxygen cause problems as following. Firstly, the baking process in vacuum can remove carbon-containing polymers, but not the natural oxide layer formed on the surface of the lower metal wiring which increases the interface resistance. Secondly, sputtering using argon gas can completely remove the natural oxide layer, but it causes leakage current caused by argon ions penetrating the lower metal wiring. Finally, annealing using the nitrogen and oxygen can completely remove the natural oxide layer but not carbon-containing polymers produced while forming the contact hole, resulting in the increase of the device resistance.

U.S. Pat. No. 6,069,073 discloses a method for annealing the surface of refractory metal in a gaseous atmosphere of $NH_3$.

SUMMARY OF THE INVENTION

The present invention has been made in an effort to solve the above problem(s), and an object of the present invention is to provide a method for forming a plug of a semiconductor device which is capable of enhancing device characteristic(s) and device reliability by reducing interface contact resistance inside the contact hole connecting upper and a lower metal wirings.

In order to solve the above problem(s), a method for forming a plug of a semiconductor device of the present invention comprises annealing a semiconductor substrate having the contact hole in an environment containing $NH_3$ gas, the semiconductor substrate having thereon a metal wiring, an interlayer dielectric layer on the metal wiring, and a contact hole partially exposing the metal wiring in the interlayer dielectric layer; plasma processing the annealed semiconductor substrate using in the presence of $NH_3$; and forming a barrier layer on the interlayer dielectric layer and in the contact hole.

Preferably, the metal wiring comprises copper.

Preferably, the method for forming the plug further includes the steps of filling the contact hole by depositing a conductive layer on the barrier layer, annealing the conductive layer, and chemical mechanical polishing the conductive layer and the barrier layer until an upper surface of the interlayer dielectric layer is exposed and/or planarized.

Preferably, the annealing and plasma processing are steps carried out, in-situ, in the same chamber in which the barrier layer is formed on the interlayer dielectric layer, at a temperature in the range of 150~500° C., and/or a pressure in the range of 5~70 Torr.

DETAILED DESCRITPION OF THE PREFERRED EMBODIMENTS

Figure 1:
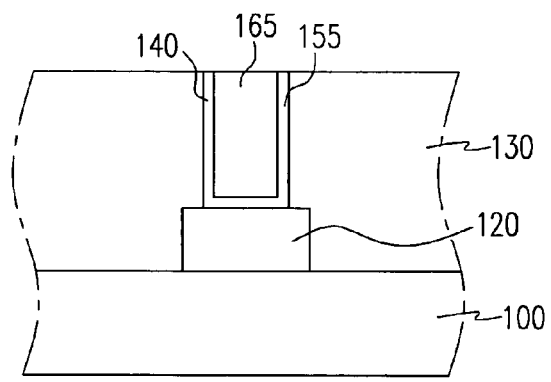
FIG. 1 is a cross-sectional view schematically illustrating a plug of a semiconductor device according to a preferred embodiment of the present invention.

With reference to the accompanying drawings, the present invention will be described in order for those skilled in the art to be able to implement it. However, the invention is not limited to the embodiments to be described hereinafter, but to the contrary, the described embodiments are intended to cover various modifications and equivalent arrangements included within the sprit and scope of the appended claims.

To clarify multiple layers and regions, the thicknesses of the layers are enlarged in the drawings. Wherever possible, the same reference numbers will be used throughout the drawing(s) to refer to the same or like parts or structures. When it is said any part or structure such as a layer, film, area, or plate is positioned on another part or structure, it means the part or structure is directly on the other part or is positioned above the other part or structure, with at least one intermediate part or structure therebetween. Any part or structure that is positioned directly on another part or structure means that there is no intermediate part or structure between them.

A semiconductor device according to a preferred embodiment of the present invention will be described hereinafter with reference to the accompanying drawings.

FIG. 1 is a cross-sectional view schematically illustrating a plug of a semiconductor device according to a preferred embodiment of the present invention.

As shown in FIG. 1, an interlayer dielectric layer 130 is formed on a semiconductor substrate 100 having one or more lower layer structures such as metal wiring 120. The interlayer dielectric layer 130 typically comprises a conventional insulating material and has a contact hole 140 partially exposing the metal wiring therethrough.

On a sidewall and bottom of the contact hole 140 of the interlayer dielectric layer 130 is a diffusion protection layer 155. The diffusion protection layer 155 can be a dual layer of successively deposited TaN and Ta films, or it can be a single layer comprising TiSiN. On the diffusion protection layer 155, a conductive layer comprising copper (Cu) fills the remainder of contact hole 140 to form, at least in part, metal plug 165.

A method for forming the plug of the above-structured semiconductor device according to the preferred embodiment of the present invention will be described hereinafter with reference to the accompanying drawings.

FIG. 2*a* to FIG. 2*d* are cross-sectional views illustrating fabricating steps of the plug according to the preferred embodiment of the present invention.

Figure 2A:
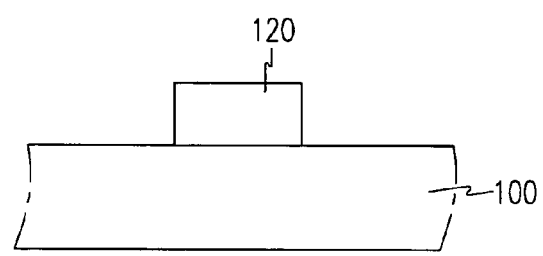
FIG. 2a to FIG. 2d are cross-sectional views illustrating fabricating steps for making the plug according to a preferred embodiment of the present invention.

As shown in FIG. 2*a*, a conductive layer is formed on a semiconductor substrate 100 and then selectively etched so as to form a metal wiring 120. Metal wiring 120, which is generally a lower metal layer (e.g., M1, M2, M3, etc.), typically comprises a conventional, photolithographically formed metal, such as aluminum (which may further contain from 0.5 to 4 wt. % of copper, silicon and/or titanium), titanium, titanium nitride (TiN), titanium-tungsten alloy, etc. Metal wiring 120 may therefore comprise a multi-layer structure, such as a laminated barrier layer/bulk conductor/antireflective coating (e.g., TiN/Al/TiN, TiN/Al/Ti, TiW/Al/TiW, etc.). Alternatively, the lower layer of metal may comprise a "dual damascene" type of metal; e.g., the same as barrier layer 155 and metal plug 165 (e.g., copper with a TaN/Ta or TiSiN barrier layer).

Figure 2B:
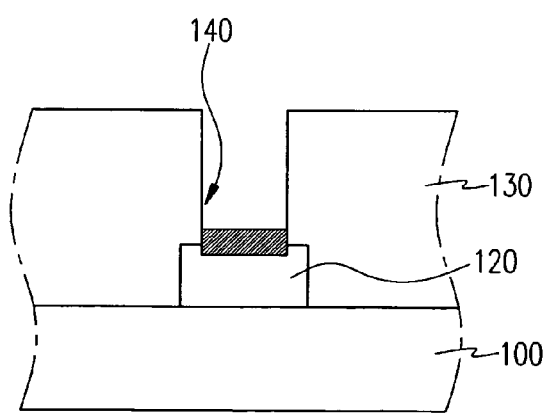

Next, as shown in FIG. 2*b*, an interlayer dielectric layer 130 is formed on the semiconductor substrate 100 having the metal wiring 120 thereon by depositing a dielectric material (such as a conventional silicon oxide layer, which may be undoped or doped with a conventional concentration of fluorine or boron and/or phosphorous). Then, a contact hole 140, which partially exposes the metal wiring 120, is formed using conventional photolithography and etch processes.

In this case, unexpectedly, the metal wiring 120 exposed through the contact hole may reacts with oxygen in the etch chamber atmosphere so as to form a natural oxide layer (slanted line portion). Also, there is another problem in that a polymer (slanted line portion) formed from a material in the etch chamber such as carbon (C) may be deposited on the surface of the metal wiring 120 exposed through the contact hole 140 during the photolithography and etch processes.

Figure 2C:
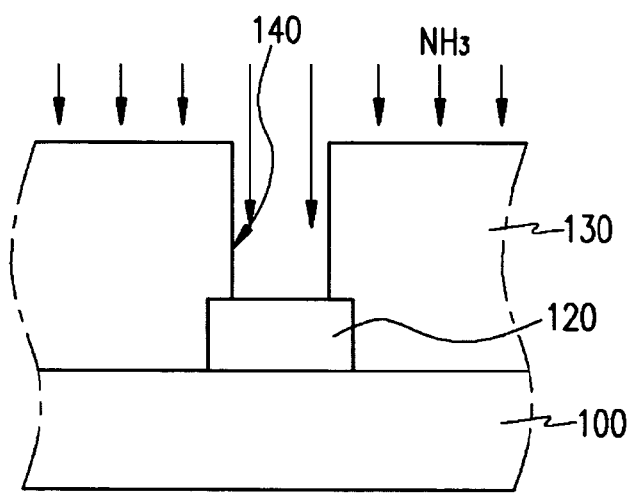

Accordingly, in order to remove the natural oxide layer and/or the polymer (slanted line portion), an annealing process and a plasma process are performed, using $NH_3$ gas (see FIG. 2*c*).

In more detail, firstly, the annealing process is carried out using $NH_3$ gas, which is a reducing gas to the natural oxide layer and the polymer that may be formed on metal wiring. Annealing is generally conducted at a temperature in the range of from 150 to about 500° C. and/or at a pressure in the range of from 5 to about 70 Torr. In this manner, the oxygen of the natural oxide layer is believed to react with the hydrogen of the $NH_3$ gas such that the natural oxide layer is completely removed.

After the annealing process, the substrate is plasma-processed with $NH_3$ gas and, optionally, one or more other plasma gasses (e.g., chemically active gasses such as hydrogen [$H_2$], hydrazine [$N_2H_4$], $N_2O$, $O_2$, etc., and/or carrier gasses such as $N_2$, He, Ar, etc.) at a temperature of from 150 to about 500° C. and at a pressure of from 5 to about 70 Torr. At this time, polymers primarily containing atoms such as carbon (C), hydrogen (H) and/or fluorine (F) remaining on the surface of the metal wiring 120 are removed by the $NH_3$ plasma gas so as to decrease the interface contact resistance in the contact hole 140. Alternatively, the annealing and plasma processing steps may be reversed, since the carbon-based polymer and the native metal oxide may be formed at about the same time during etching of the contact hole 140. In either case, the annealing and plasma processing steps may be conducted in the same chamber (e.g., a plasma processing chamber in which the wafer may be heated to a temperature of from about 150 to about 500° C.). In a further alternative, the $NH_3$ gas may replaced with one or more gasses that are believed to provide substantially the same chemically reactive species as ammonia (e.g., a source of hydrogen atoms and nitrogen atoms, such as $N_2H_4$ or a mixture of $H_2$ and $N_2$, etc.).

Figure 2D:
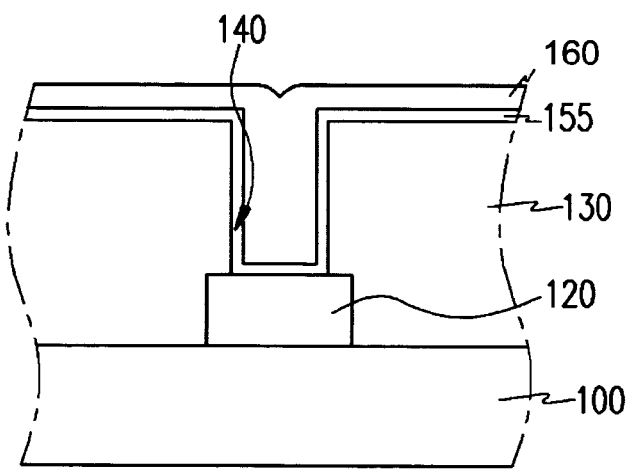

As shown in FIG. 2*d*, a barrier layer 150 is formed on the interlayer dielectric layer 130 and in the contact hole 140, and then a conductive layer 160 comprising a metal such as copper is thickly deposited, sufficiently to fill the contact hole 140. Here, the barrier layer 150 can be a dual layer formed by sequentially depositing TaN/Ta, or a single layer comprising TiSiN. As described above, copper is preferred for conductive layer 160. Thus, the step of forming contact hole 140 may be followed or preceded (preferably followed) by a step of forming a trench to be subsequently filled by conductive layer 160. In fact, when the step of forming contact hole 140 is followed by a trench-forming step, typically a photoresist material is deposited into contact hole 140. Incomplete removal of the photoresist material in contact hole 140 may also result in polymer formation on the sidewalls and bottom of contact hole 140, which polymer can also be removed by the present invention. Although copper is preferred, any conventional metal plug material, such as tungsten (W, which may be deposited by CVD) or even aluminum (Al) may fill the remainder of the contact hole to form metal plug 165 and an upper metal wiring layer in the trench. As a result, barrier layer may comprise a conventional Ti/TiN or Ti/TiW bilayer or a conventional TiW monolayer.

As a result of the present invention, impurities that may be trapped in the contact hole 140 during the deposition of the conductive layer 160 are removed or reduced by the present annealing and plasma treatment processes in the presence of ammonia ($NH_3$) gas.

As shown in FIG. 1, until the upper surface of the interlayer dielectric layer 130 is exposed, the intermediate product is planarized by chemical mechanical polishing. Consequentially, the conductive layer is formed only in the contact hole 140 to form a metal plug 165 made of a conductive layer and a diffusion protection layer 155 formed from the barrier layer.

Although preferred embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

As described above, according to the present invention it is possible to reduce the interface contact resistance of the contact hole by removing the foreign substance such as natural oxide layer and polymer that are form on the surface of the exposed metal wiring, resulting in stabilization of the device characteristics and functions.

What is claimed is:

1. A method for forming a plug in a semiconductor device comprising:

annealing a semiconductor substrate in a chamber in an environment containing $NH_3$ gas, the semiconductor substrate having thereon a metal wiring, an interlayer dielectric layer on or over the metal wiring, and a contact hole in the interlayer dielectric layer partially exposing the metal wiring;

plasma processing the annealed semiconductor substrate including the contact hole in the interlayer dielectric layer and the exposed metal wiring in-situ in the chamber in the presence of $NH_3$ sufficiently to remove a polymer on the exposed metal wiring; and forming a barrier layer on the interlayer dielectric layer and in the plasma processed contact hole in-situ in the chamber.

2. The method of claim 1, wherein the metal wiring comprises copper.

3. The method of claim 1, further comprising:
depositing a conductive layer on the barrier layer to fill the contact hole;
annealing the conductive layer; and
chemical mechanical polishing the conductive layer and the barrier layer until an upper surface of the interlayer dielectric layer is exposed.

4. The method of claim 1, wherein the annealing and plasma processing are carried out at a pressure in the range of from 5 to about 70 Torr.

5. The method of claim 1, wherein the semiconductor substrate is annealed sufficiently to reduce a native oxide.

6. The method of claim 1, wherein forming the barrier layer comprises plasma depositing the barrier layer.

7. The method of claim 1, wherein the annealing and plasma processing are carried out at a temperature in the range of from 150 to about 500° C.

8. The method claim 7, wherein the annealing and plasma processing are carried out at a pressure in the range of from 5 to about 70 Torr.

9. The method of claim 1, further comprising forming the metal wiring on the semiconductor substrate.

10. The method of claim 9, further comprising forming the interlayer dielectric layer on or over the metal wiring.

11. The method of claim 10, further comprising selectively etching the interlayer dielectric layer to form the contact hole.

12. The method of claim 11, wherein the annealing and plasma processing are carried out at a temperature in the range of from 150 to about 500° C.

13. A method for forming a plug in a semiconductor device comprising:
annealing a semiconductor substrate in a chamber in an environment containing $NH_3$ gas or $N_2H_4$ the semiconductor substrate having thereon a metal wiring, an interlayer dielectric layer on or over the metal wiring, and a contact hole in the interlayer dielectric layer partially exposing the metal wiring;

plasma processing the annealed semiconductor substrate including the contact hole in the interlayer dielectric layer and the exposed metal wiring in-situ in the chamber in the presence of said $NH_3$ gas or $N_2H_4$ sufficiently to remove a polymer on the exposed metal wiring; and forming a barrier layer on the interlayer dielectric layer and in the plasma processed contact hole in-situ in the chamber.

14. The method of claim 13, wherein the environment contains $NH_3$ gas.

15. The method of claim 13, wherein the environment contains $N_2H_4$.

16. The method of claim 13 wherein the metal wiring comprises copper.

17. The method of claim 13 further comprising:
depositing a conductive layer on the barrier layer to fill contact hole;
annealing the conductive layer; and
chemical mechanical polishing the conductive layer and the barrier layer until an upper surface of the interlayer dielectric layer is exposed.

18. The method of claim 13, wherein the annealing and plasma processing are carried out at a temperature in the range of from 150 to about 500°C.

19. The method of claim 13, wherein the annealing and plasma processing are carried out at a pressure in the range of from 5 to about 70 Torr.

20. The method of claim 13, further comprising forming the metal wiring on the semiconductor substrate, forming the interlayer dielectric layer on or over the metal wiring, and selectively etching the interlayer dielectric layer to form the contact hole.

21. The method of claim 13 wherein the semiconductor substrate is annealed sufficiently to reduce a native oxide.

22. The method of claim 13, wherein forming the barrier layer comprises plasma depositing the barrier layer.

* * * * *